SUPERHETERODYNE RECEIVER WITH OFF-TUNE SQUELCH CIRCUIT FOR AUTOMATIC FREQUENCY CONTROL

Filed March 1, 1955

INVENTORS
ALFRED ZUCKERMAN
BY
ATTORNEY

United States Patent Office 2,844,713

Patented July 22, 1958

2,844,713

SUPERHETERODYNE RECEIVER WITH OFF-TUNE SQUELCH CIRCUIT FOR AUTOMATIC FREQUENCY CONTROL

Alfred M. Zuckerman, Valley Stream, N. Y., assignor to David Bogen & Company, Inc., a corporation of New York Application March 1, 1955, Serial No. 491,302

5 Claims. (Cl. 250—20)

The invention relates to frequency control circuits and more specifically to frequency modulation receivers provided with automatic frequency control.

One of the objects of the invention is a frequency modulation tuner, which permits accurate tuning with a minimum of adjustments and under control of the adjustment movement.

Another object of the invention is an improved squelching circuit also under control of the tuning movement.

Still another object of the invention is an improved automatic frequency control circuit, permitting control of the frequency over a wide range of deviations from such frequency.

A more specific object of the invention is an automatic locking circuit, fixing accurate tuning conditions even in a position of the tuner relatively removed from the position of the tuner corresponding to such accurate tuning conditions.

Still further, an object of the invention is to use the absence of a signal derived from a channel in an off-tune condition of the tuner, to disconnect or disable the automatic frequency control circuit, or at least a part thereof, and to use a signal amplitude of predetermined level to reconnect or restitute the automatic frequency control circuit after a predetermined time interval, thereby permitting the tuner to be adjusted to its accurate tuning condition, whereupon automatic frequency control is again and automatically reestablished.

In this way the so-called rubber band effect exerted by the operation of the automatic frequency control during a tuning process and frequently preventing or impeding return to the accurate tuning position, once such tuning position has been even slightly by-passed, is avoided, without substantially impairing or affecting the general effectiveness of the automatic frequency control of the receiver.

These and other objects of the invention will be more fully understood from the drawings in which Figure 1 represents in block diagram a frequency modulation radio receiver incorporating a tuner and associated equipment and embodying certain principles of the invention.

Figures 1, 2, 3, 4, 5, 6:
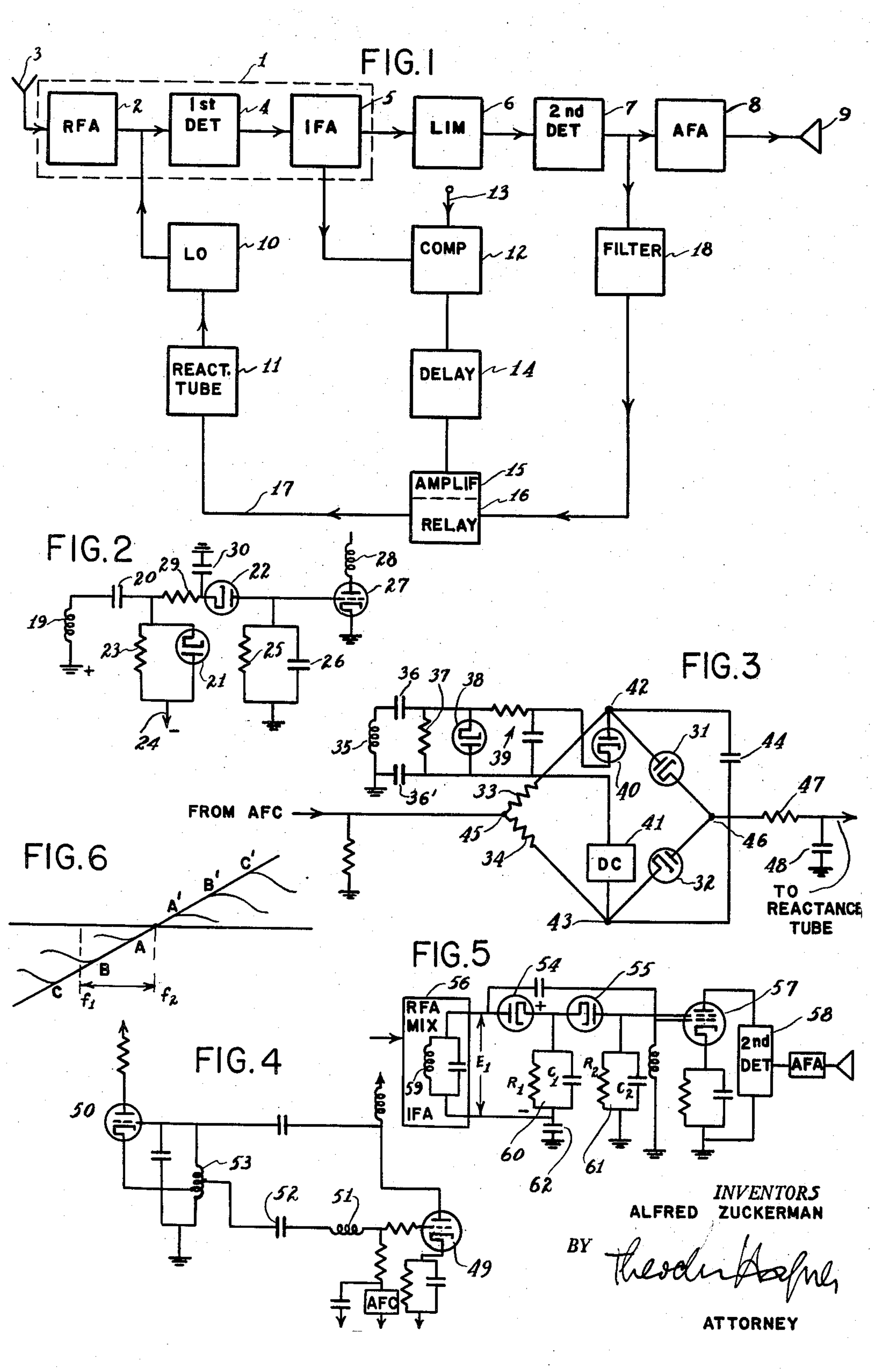
Figure 2 represents a portion of the receiver shown in Figure 1 causing automatic reconnection or restitution after a predetermined time interval of the automatic frequency control, such restitution being operative under control of an off-tune position.
Figure 3 represents a modification of Figure 1, comprising purely electronic means for causing automatic restitution of the frequency control.
Figure 4 represents an automatic frequency control circuit permitting a wider range of frequency control.
Figure 5 represents an improved squelching circuit, also under control of and depending upon an off-tune position of the tuner.
Figure 6 represents a corresponding graph of operating characteristics.

In Figure 1 a frequency modulation tuner 1 is shown to contain in otherwise well known manner, a radio frequency amplifier 2 coupled to a receiving antenna 3 on its input side, and to a first detector 4 on its output side.

First detector 4 in turn controls over intermediate frequency amplifier 5, limiter 6, a second or frequency modulation detector 7, operating through audio amplifier 8 a loud speaker 9.

In the example shown automatic frequency control is achieved, also in otherwise well known manner, or in any other appropriate manner, without exceeding the scope of this disclosure, by injecting into the input circuit of first detector 4 the freqeuncy derived from a local oscillator 10 which in turn is controlled by a reactance stage or tube 11.

In accordance with one of the features of the invention, a positive voltage is branched off or derived from the output circuit of intermediate frequency amplifier 5, and applied to a comparison stage or network 12—examples of which will be described further below in connection with Figures 2 and 3—to be compared with or added to a predetermined negative or biasing voltage applied over line 13.

The result of this comparison or addition process is applied over a delay circuit 14 of the resistance-capacity type or any other appropriate structure to an amplifier 15 forming or controlling a relay 16 of the electro-mechanical or electronic type, inserted in the circuit line 17 feeding the automatic frequency control voltage to reactance stage 11. This automatic frequency control voltage is derived over low pass filter 18 from the output of the second or frequency modulation detector 7.

Thus in a predetermined position of the tuner, for example, after an accurate position of tuning has been bypassed by the operator of the receiver, and after the automatic frequency control has been disabled by the absence of a signal of predetermined value, in the presence of only a small signal beyond that predetermined value at the output of intermediate frequency amplifier 7, the comparison circuit will operate and cause operation of relay 16 and cause reinsertion of the automatic frequency control voltage over line 17.

Delay circuit 14 is so adjusted that at a perdetermined and preferably adjustable time interval, of the order of about five to ten seconds, for example, relay amplifier 15 will be energized and thereby relay 16 operated to reestablish automatic frequency control voltage over line 17.

During that predetermined delay and while the automatic frequency control line 17, is still disabled or interrupted, the rubber band effect of this circuit is cut off from operation and the tuner can easily be adjusted and shifted back into the corresponding accurate tuning position.

In a preferred realization of the invention such as shown in Figure 2, the intermediate frequency output of 10.7 megacycles is applied over output coil 19 and coupling condenser 20 to a comparing circuit including a pair of diodes 21, 22.

Diode 21 is shunted by resistor 23 and connected to a source of predetermined and preferably adjustable negative potential, 24.

Diode 22 is connected over a delay circuit including resistor 25 and shunt capacity 26 to the grid of an amplifier or gating tube 27. The anode circuit of tube 27 contains a relay coil 28 connecting or interrupting as the case may be an automatic frequency control line such as shown in Figure 1 at line 17, or any other element of an automatic frequency control circuit such as shown in Figure 1 or on any other automatic frequency control circuit.

The circuit of Figure 2 operates in the following manner:

When there is no, or practically no, intermediate frequency signal present across output coil 19, diode 21 will be blocked and diode 22 will conduct the negative bias voltages charging condenser 26.

In this way a negative voltage is quickly impressed on the grid of tube 27 and tube 27 will be cut off. As a result relay coil 28 will be de-energized thereby keeping the automatic frequency control voltage from the frequency control circuit or reactance tube 11 shown in Figure 1.

The same will also occur in the course of a tuning process whenever the voltage across coil 19 is less than a predetermined value.

If therefore in accordance with a tuning operation, the signal voltage or a voltage derived therefrom, should exceed on the average that predetermined value, a net positive voltage will appear at the junction of diode 22 and condenser 30 to ground. This positive voltage cannot pass by diode 22 so that condenser 26 will slowly discharge through resistor 25 thereby bringing the voltage at the grid of tube 27 to zero, or close to zero with respect to ground. This will occur after a predetermined time interval depending upon the time constant of condenser 26 and resistance 25, and it will cause tube 27 to conduct after a predetermined time interval.

This time interval permits the operator to continue the tuning process without being hampered by the automatic frequency control and its rubber band effect.

A resistance capacity filter circuit indicated at 29, 30 insures operation of the automatic frequency control on the long term average value of the radio frequency signal amplitude. If the time constant of filter 29, 30 is made low in comparison to an audio signal, such as 50 microseconds, condenser 26 will be charged when the instantaneous—rather than the long term average—value of the signal amplitude falls below that predetermined value.

As stated before a delay time of five to ten seconds has been found practically sufficient to permit accurate tuning while the automatic frequency control remains disabled, in accordance with the invention.

In the modification of Figure 3 the electro-mechanical relay circuit is replaced by an electronic relay in the form of a bridge circuit in which under control of absence or little radio frequency signal voltage, passage of the automatic frequency control voltage is blocked.

On the other hand under control of a signal voltage exceeding a predetermined amount, passage of the automatic frequency control voltage of any polarity is permitted after a predetermined time delay.

More specifically in Figure 3 a pair of diodes 31, 32 are connected in opposite direction in the two arms of a bridge circuit with resistors 33, 34 forming the two other arms of the bridge.

The intermediate frequency output coil operating the bridge circuit is shown at 35 and is connected over coupling condensers 36, 36′, filter circuit 37 to diode 38 and is further connected over a second filter circuit 39, consisting of condenser and resistor in series with a diode 40 and a negative direct current bias source 41 which in this case is a detected voltage of the broadcast band local oscillator, but of course may be any other type of appropriate voltage source without departing from the scope of this disclosure—between the two diagonal points 42, 43 of bridge 31—34, thereby holding the latter point at a floating potential.

Diagonal points 42, 43 are also shunted by a condenser 44.

The two remaining diagonal points 45, 46 of bridge 31—34 are connected, respectively, one to the automatic frequency control source and the other over a resistor-condenser filter network 47, 48 the grid of a reactance tube or another element controlling the frequency of the local oscillator.

In the operation of Figure 3, again, as previously explained with respect of Figure 2, when there is no or little intermediate frequency signal present across output coil 35, diodes 31, 34 are blocked or cut off and no automatic frequency control current will pass in either direction of bridge 31—34.

However, as soon as an intermediate frequency signal exceeding a predetermined low level will appear across coil 33, both diodes 31, 32 will be unblocked after a predetermined time interval, and automatic frequency control voltage will be permitted to pass in either direction of bridge 31—34 to the grid of the reactance stage controlling the local oscillator.

There again such passage is delayed by the discharge of condenser 44 so that the automatic frequency control voltage will only be able to pass after a predetermined time interval, for example, five to ten seconds, thereby permitting during this time interval accurate tuning without interference from the rubber band effect caused by the operation of the automatic frequency control.

Figure 4 shows an automatic frequency control circuit especially applicable in accordance with the invention.

In Figure 4 a reactance tube 49 is shown to control a tank circuit of a local oscillator tube 50 over an inductance 51, which is coupled over blocking condenser 52 to a tap of tank coil 53.

The cathode of ascillator 50 is also connected to a tap of tank coil 53 and preferably to the same tap as condenser 52.

Inductance 51 will resonate the internal grid-cathode capacity of reactance tube 49 while at the same time the grid of oscillator tube 50 is capacitively coupled to the plate of reactance tube 49 thereby causing the oscillation tank circuit to be affected by the reactive current of tube 55.

This arrangement has been found to permit with a predetermined control voltage a much greater swing of frequency deviation without loading the oscillator. This favorably compares with a direct capacity coupling between the grid of reactor tube 49 and the top end of the tank circuit of oscillator tube 50, as has been used heretofore.

At a given range of frequency deviation there is less loading of the oscillator, or alternatively the automatic frequency control range is increased without additional loading of the oscillator.

In Figure 5 the invention is applied to a squelch circuit to avoid disagreeable noise and distortion in case the frequency modulation tuner is adjusted to marginal transmission.

In this case the difficulty has been found to be in that if the signal lies above the level which prevails during most, but not all of the audio cycle, then squelch noise appears and disappears spuriously during the audio cycle and thereby distorts the signal.

As apparent from the experiments underlying the invention, the resulting operation characteristic of the limiter-intermediate frequency amplifier detector combination provides just the signal information needed to determine the squelching point and to overcome these difficulties.

In accordance with the invention the squelch circuit is operated and the receiver completely quieted whenever the signal goes beyond the overall detection characteristic of the linear frequency range for even a small portion of the audio cycle, and also when the signal drops to a lower level when noise becomes objectionable.

In accordance with the invention these two operating points have been caused to coincide.

If now the detector characteristic, or rather the overall characteristic of the receiver is traced, i. e. instantaneous output vs. frequency with signal strength as a parameter, a family of curves is obtained as apparent from the graph shown in Figure 6.

In Figure 6 the points AA′, BB′, etc. occur when the output of the limiter is inadequate to drive the detector properly.

Trouble, for example, occurs when, during the tuning process, there is misadjustment and the swing from $f_1$ to $f_2$ occurs with an intensity corresponding to the BB′ curve.

During the interval while the frequency lingers near $f_1$, the input is inadequate and distortion takes place.

In accordance with the invention a detector is realized which restores the output voltage if at any time during a reasonably chosen previous period, for example, for a period of fifty milliseconds, or a few audio cycles, the input stays above a predetermined danger point or minimum value.

For this purpose, as apparent from Figure 5, two detectors 54, 55 are connected in series cascade but of opposite conductivity, to suppress the audio output, and connected between the intermediate frequency amplifier 56 of a frequency modulation tuner and a gating electrode of the first limiter 57 feeding the second detector 58 of radio receiver of the frequency modulator type.

As further apparent from Figure 5, the output coil 45 of the tuner 59—or its intermediate frequency amplifier—is also connected to the gating grid of limiter 57 over two resistance capacity circuits 60, 61.

One of these circuits acts as a filter circuit to eliminate the intermediate frequency while the other circuit 61 is an integrating circuit which allows condenser $C_2$ to charge and slowly to discharge.

The output voltage thus obtained serves to paralyze or disable an operative portion of the receiver.

The time constant of circuit 60 and elements $C_1$, $R_1$ should be kept to a value which is much less than an audio period. The time constant of circuit 61 and elements $C_2$, $R_2$ should be made greater, or approximately of the order of several audio cycles. Battery or voltage supply 62 determines the level below which squelch or nose suppression is operated.

In operation of the circuit whenever voltage $E_1$ drops even for an instant below a predetermined voltage or the point at which squelch operates, then the cathode of diode 54 is negative with respect to ground and diode 55 conducts placing a negative charge on condenser $C_2$ which paralyzes tube 57 until the charge has time enough to leak off.

The invention is not limited to the circuit elements and circuit connections shown and descirbed, but may be applied in any manner, or form whatsoever, without departing from the scope of this disclosure.

I claim:

1. In a frequency modulation receiver, a cascade arrangement of a radio frequency amplifier, a first detector, an intermediate frequency amplifier and a second detector; and a local oscillator controlling the input of said first detector, means under control of the output of said second detector for controlling the frequency of said local oscillator, and means under control of the output of said intermediate frequency amplifier for enabling said frequency control means under control of an intermediate frequency signal amplitude above a predetermined value and after predeterminedly fixed time delay; said enabling means including a pair of serially connected diodes, one of which is normally blocked at a signal below a predetermined amplitude and the other being normally unblocked; there being provided means for unblocking the first diode and blocking the second diode under control of a signal exceeding said predetermined amplitude; and delay means under control of said second diode for enabling said frequency control means at a predetermined time interval after the blocking of said second diode.

2. Receiver according to claim 1, comprising a filter circuit connected to the junction point of said diode.

3. Receiver according to claim 1, comprising a resistance capacitor delay circuit connected to said second diode, the capacitor being adapted to be charged immediately before blockage of said diode and gradually discharging for a predetermined time interval after such blockage, means being provided under control of said capacitor to control the said frequency control means.

4. Receiver according to claim 2, wherein said diodes are arranged oppositely connected in adjacent arms of a bridge circuit, the intermediate frequency signal being applied to one pair of diagonal points of said bridge circuit and said frequency control means being applied to the opposite pair of diagonal points of said bridge circuit, a delay circuit being applied across said first diagonal points to permit blocking of the two diodes under control of a signal below a predetermined amplitude at the intermediate frequency amplifier, and gradual unblocking of said diodes under control of a signal beyond said predetermined amplitude and depending upon the delay characteristic of said delay circuit, so as to permit passage of a frequency control signal after such delay in either direction of said bridge circuit.

5. In a frequency modulation receiver, a pair of serially connected diodes one controlling the other, an intermediate frequency amplifier connected to the junction point of said diodes to control one of said diodes, a radio frequency amplifier controlling said intermediate frequency amplifier and an electronic relay controlled by the other of said diodes; the diodes forming two adjacent branches of a bridge circuit, the two other branches containing resistors, the two diagonal points adjacent said diodes providing connection with said intermediate frequency amplifier and the two other diagonal points providing passage of an automatic frequency control signal.

References Cited in the file of this patent

UNITED STATES PATENTS

| | | |
|---|---|---|
| 2,121,736 | Foster | June 21, 1938 |
| 2,135,949 | Van Roberts | Nov. 8, 1938 |
| 2,172,456 | Schock | Sept. 12, 1939 |
| 2,331,821 | Winlund | Oct. 12, 1943 |
| 2,513,786 | Crosby | July 4, 1950 |
| 2,567,286 | Hugenholtz | Sept. 11, 1951 |
| 2,576,552 | Wittenberg | Nov. 27, 1951 |
| 2,691,097 | Atwood | Oct. 5, 1954 |

FOREIGN PATENTS

| | | |
|---|---|---|
| 76,455 | Norway | Mar. 27, 1947 |